(12) United States Patent
Sidhu et al.

(10) Patent No.: US 12,125,935 B2
(45) Date of Patent: Oct. 22, 2024

(54) METHOD FOR INTEGRATING A DISPENSABLE LIGHT TRANSMISSIBLE APERTURE IN THE CAP OF A THIN LIGHT SENSOR MODULE

(71) Applicant: STMicroelectronics Asia Pacific Pte Ltd, Singapore (SG)

(72) Inventors: Jaspreet Singh Sidhu, Singapore (SG); Tat Ming Teo, Singapore (SG)

(73) Assignee: STMicroelectronics Asia Pacific Ptd Ltd, Singapore (SG)

( * ) Notice: Subject to any disclaimer, the term of this patent is extended or adjusted under 35 U.S.C. 154(b) by 953 days.

(21) Appl. No.: 17/083,669

(22) Filed: Oct. 29, 2020

(65) Prior Publication Data

US 2022/0140176 A1 May 5, 2022

(51) Int. Cl.
*G01J 1/02* (2006.01)
*B29C 43/02* (2006.01)
(Continued)

(52) U.S. Cl.
CPC .......... *H01L 31/186* (2013.01); *B29C 43/027* (2013.01); *B29C 43/183* (2013.01);
(Continued)

(58) Field of Classification Search
CPC . H01L 31/186; H01L 31/0203; B29C 43/027; B29C 43/183; B29C 43/36;
(Continued)

(56) References Cited

U.S. PATENT DOCUMENTS

| 4,340,282 A * | 7/1982 | Murakami | ............... G02C 1/06 |
| | | | 351/86 |
| 7,502,183 B2 * | 3/2009 | Jao | ........................ G02B 7/021 |
| | | | 348/340 |

(Continued)

OTHER PUBLICATIONS

Zhao, Jicong, et al.: "A Novel 3D Encapsulation Structure Based on Subwavelength Structure and Inserted Pyrex Glass for RF MEMS Infrared Detectors," Electronics, 2019, 8, 974; doi: 10.3390/electronics8090974, www.mdpi.com/journal/electronics, 12 pages.

(Continued)

*Primary Examiner* — Edmond C Lau
*Assistant Examiner* — Jarreas Underwood
(74) *Attorney, Agent, or Firm* — Crowe & Dunlevy LLC (57) ABSTRACT

A method of making a light sensor module includes connecting a light sensing circuit to an interconnect on a substrate, and forming a cap. The cap is formed by producing a cap substrate from material opaque to light to have an opening formed therein, placing the cap substrate top-face down, dispensing a light transmissible material into the opening, compressing the light transmissible material using a hot tool to thereby cause the light transmissible material to fully flow into the opening to form at a light transmissible aperture, and placing the cap substrate into a curing environment. A bonding material is dispensed onto the substrate. The cap is picked up and placed onto the substrate positioned such that the light transmissible aperture is aligned with the light sensing circuit, with the bonding material bonding the cap to the substrate to thereby form the light sensor module.

11 Claims, 4 Drawing Sheets

(51) Int. Cl.
  *B29C 43/18*      (2006.01)
  *B29C 43/36*      (2006.01)
  *B29C 43/52*      (2006.01)
  *G01J 1/04*       (2006.01)
  *H01L 31/0203*    (2014.01)
  *H01L 31/18*      (2006.01)

(52) U.S. Cl.
  CPC .............. *B29C 43/36* (2013.01); *B29C 43/52* (2013.01); *G01J 1/0271* (2013.01); *G01J 1/0407* (2013.01); *H01L 31/0203* (2013.01); *B29C 2043/029* (2013.01); *B29C 2043/3615* (2013.01)

(58) Field of Classification Search
  CPC .............. B29C 43/52; B29C 2043/029; B29C 2043/3615; G01J 1/0271; G01J 1/0407
  See application file for complete search history.

(56) References Cited

U.S. PATENT DOCUMENTS

| | | | |
|---|---|---|---|
| 7,589,785 B2* | 9/2009 | Kobayashi | H04N 23/56 348/371 |
| 10,015,296 B1* | 7/2018 | Haymond | H04M 1/0252 |
| 10,165,954 B2 | 1/2019 | Lee | |
| 2005/0212947 A1* | 9/2005 | Sato | H01L 27/14618 348/340 |
| 2006/0201040 A1* | 9/2006 | Lewis | G09F 21/049 40/649 |
| 2009/0196559 A1 | 8/2009 | Makino et al. | |
| 2014/0078594 A1* | 3/2014 | Springer | G02B 7/16 359/821 |
| 2015/0217531 A1 | 8/2015 | Suess et al. | |
| 2015/0221835 A1 | 8/2015 | Tischler et al. | |
| 2016/0202496 A1* | 7/2016 | Billetz | G02C 1/10 351/86 |
| 2017/0052277 A1* | 2/2017 | Wong | H01L 25/167 |
| 2018/0017741 A1 | 1/2018 | Ho et al. | |
| 2018/0026020 A1 | 1/2018 | Geiger | |
| 2018/0364441 A1* | 12/2018 | Hubert | H04N 23/687 |

OTHER PUBLICATIONS

EP Search Report and Written Opinion for family-related EP Appl. No. 21195431.8, report dated Mar. 3, 2022, 7 pages.

* cited by examiner

METHOD FOR INTEGRATING A DISPENSABLE LIGHT TRANSMISSIBLE APERTURE IN THE CAP OF A THIN LIGHT SENSOR MODULE

TECHNICAL FIELD

This disclosure is directed to a cap design for a thin light sensor module and, more particularly, to a method for forming light transmissible apertures in the cap in a fashion that enables the cap to have a thinner upper wall than prior art designs, thereby enabling the production of the thin light sensor module.

BACKGROUND

Mobile electronic devices, such as smartphones, tablets, earbuds, headphones, earphones, and smartwatches, typically employ one or more light sensor modules. For example, a smartphone may employ a light sensor module to detect proximity of a user's ear, so as to know to switch its touch screen off while the user makes a voice call, thereby ensuring the user's ear does not provide an inadvertent input to the touch screen. As another example, a smartphone may have a camera system that employs a light sensor module to detect ambient lighting conditions so as to adjust camera settings to produce better images when the user takes a picture.

Such light sensor modules are typically formed by placing passive and/or active light sensing components on a substrate, and then bonding a cap to the substrate over the light sensing components to thereby protect the light sensing components from damage. The cap includes light transmissible closed apertures, such as lenses, located over the components.

Typically, the cap is formed with openings defined therein into which the light transmissible apertures are installed, and typically such light transmissible aperture installation is performed by injection molding. While this does successfully produce the desired cap with the light transmissible apertures securely located therein, the use of injection molding limits the shapes that can be formed. In addition, injection molding is typically incapable of producing a light transmissible aperture of less than 150 µm in thickness, a limitation also typically present if the light transmissible aperture were to be formed of glass.

Current commercial needs are for light sensor modules with a decreased thickness, for example on the order of 0.4 mm to 0.8 mm. However, conventional processes are unable to produce caps for light sensors sufficiently thin to enable to the desired light sensor modules to be produced. Therefore, further development into cap design and light transmissible aperture production is needed.

SUMMARY

Disclosed herein is a method of forming a cap for a light sensor module. The method includes: producing a cap substrate from material opaque to light to have at least one opening formed therein; placing the cap substrate top-face down in a production environment; dispensing a light transmissible material into the at least one opening; compressing the light transmissible material using a hot tool to thereby cause the light transmissible material to fully flow into the at least one opening to form at least one light transmissible aperture; and placing the cap substrate into a curing environment to thereby produce the cap for the light sensor module.

The cap substrate may be produced using injection molding.

Pacing the cap substrate face down in the production environment may include: placing the cap substrate top-face down onto a top face of the tape; and placing the tape bottom-face down in the production environment.

The light transmissible material may be dispensed through a needle into the at least one opening.

The cap substrate may be produced such that a sidewall defines the at least one opening, the sidewall having at least one ridge extending therefrom, and compressing the light transmissible material using the hot tool may serve to flow the light transmissible material around the at least one ridge.

The cap substrate may be produced to have an overflow area into which excess light transmissible material can flow when the light transmissible material is compressed using the hot tool.

The method may also include removing the hot tool from the light transmissible material prior to placing the cap substrate into the curing environment.

The method may also include removing the hot tool from the light transmissible material after placing the cap substrate into the curing environment.

Placing the cap substrate into a curing environment may include placing the cap substrate into an oven.

Placing the cap substrate into a curing environment may include shining a curing light onto the light transmissible material.

Compressing the light transmissible material using the hot tool may serve to form a bottom surface of the light transmissible material to have a desired shape.

Placing the cap substrate top-face down in the production environment may include placing the cap substrate top-face down into a jig having a top surface that faces a top face of the cap.

The top surface of the jig may be shaped such that compressing the light transmissible material using the hot cool serves to form a top surface of the light transmissible material to have a shape inverse to the shape of the top surface of the jig.

Also disclosed herein is a method of making a light sensor module, including: connecting at least one light sensing circuit to an interconnect on a substrate; and forming a cap. The cap is formed by: producing a cap substrate from material opaque to light to have at least one opening formed therein; placing the cap substrate top-face down in a production environment; dispensing a light transmissible material into the at least one opening; compressing the light transmissible material using a hot tool to thereby cause the light transmissible material to fully flow into the at least one opening to form at least one light transmissible aperture; and placing the cap substrate into a curing environment to thereby produce the cap. The method may also include: dispensing a bonding material onto the substrate; and picking the cap up and placing the cap onto the substrate positioned such that the at least one light transmissible aperture is aligned with the at least one light sensing circuit, with the bonding material bonding the cap to the substrate to thereby form the light sensor module.

Connecting the at least one light sensing circuit to the interconnect may include connecting a passive light sensing circuit to the interconnect.

Connecting the at least one light sensing circuit to the interconnect may include connecting an active light sensing circuit to the interconnect.

The cap substrate may be produced using injection molding.

Placing the cap substrate face down in the production environment may include: placing the cap substrate top-face down onto a top face of the tape; and placing the tape bottom-face down in the production environment.

The light transmissible material may be dispensed through a needle into the at least one opening.

The cap substrate may be produced such that a sidewall defines at least one opening, the sidewall having at least one ridge extending therefrom, and compressing the light transmissible material using the hot tool may serve to flow the light transmissible material around the at least one ridge.

The cap substrate may be produced to have an overflow area into which excess light transmissible material can flow when the light transmissible material is compressed using the hot tool.

The method may also include removing the hot tool from the light transmissible material prior to placing the cap substrate into the curing environment.

The method may also include removing the hot tool from the light transmissible material after placing the cap substrate into the curing environment.

Placing the cap substrate into a curing environment may include comprises placing the cap substrate into an oven.

Placing the cap substrate into a curing environment may include shining a curing light onto the light transmissible material.

Compressing the light transmissible material using the hot tool may serve to form a bottom surface of the light transmissible material to have a desired shape.

Placing the cap substrate top-face down in the production environment may include placing the cap substrate top-face down into a jig having a top surface that faces a top face of the cap.

The top surface of the jig may be shaped such that compressing the light transmissible material using the hot cool serves to form a top surface of the light transmissible material to have a shape inverse to the shape of the top surface of the jig.

Also disclosed herein is a cap for a light sensor. The cap includes: a top wall; a sidewall extending generally perpendicularly from the top wall and extend therearound; and a partition sidewall extending from one portion of the sidewall to another portion of the sidewall to thereby define first and second cavities. The first cavity includes a central through-opening that extends through the top wall, and at least one relief blind-opening that extends into but not through the top wall. The at least one relief blind-opening intersects the central through-opening so as to be in fluid communication therewith.

The central through-opening may be defined by an interior sidewall extending through the top wall, and a ridge may extend outwardly from the interior sidewall.

A light transmissible aperture may be installed within the central through-opening, with the light transmissible aperture having a cavity defined in its exterior sidewall to interface with the ridge of the interior sidewall so as to mechanically anchor the light transmissible aperture within the central through-opening.

The central through-opening may be circularly shaped and the at least one relief blind-opening is semi-circularly shaped.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Now described is a method for making a cap for a light sensor for use in consumer electronics, the cap having light transmissible apertures formed therein, with "light transmissible aperture" meaning a physical structure through which light or certain bandwidths of light may pass but through which physical objects may not pass. Initially, multiple such caps are formed, for example using injection molding, to each have openings defined therein. These caps are placed on a tape (e.g., Kapton) such that the tape is attached to the top side of the caps, and the resulting tape is loaded on a reel.

Figure 1:
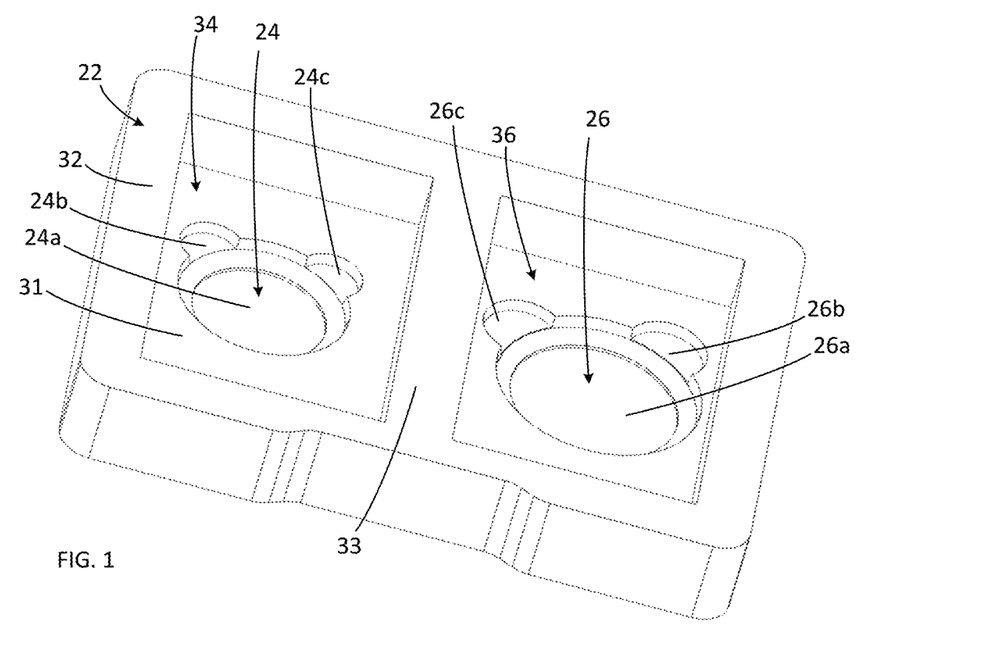
FIG. 1 is a perspective view of a bottom face of a cap described herein into which light transmissible apertures are formed using processes described herein.

The structure of each cap 22 is now described with reference to FIG. 1. The cap 22 here is opaque to light, and is shown with its bottom side facing upwardly and its top side facing downwardly. The cap 22 has a front wall 31 and sidewalls 32 extending therefrom, as well as a partition sidewall 33 extending from the front wall to define two cavities 34 and 36 respectively having openings 24 and 26 extending through the front wall. The opening 24 includes a main circularly shaped opening 24a, having two semi-circularly shaped openings 24b and 24c adjoining therewith; similarly, the opening 26 includes a main circularly shaped opening 26a, having two semi-circularly shaped openings 26b and 26c adjoining therewith. Note that the main circularly shaped opening 24a is a through opening, while openings 24b and 24c are blind openings (meaning that they do not extend fully through the front wall 31 of the cap 22); similarly, the main circularly shaped opening 26a is a through opening, while openings 26b and 26c are blind openings.

Figure 2:
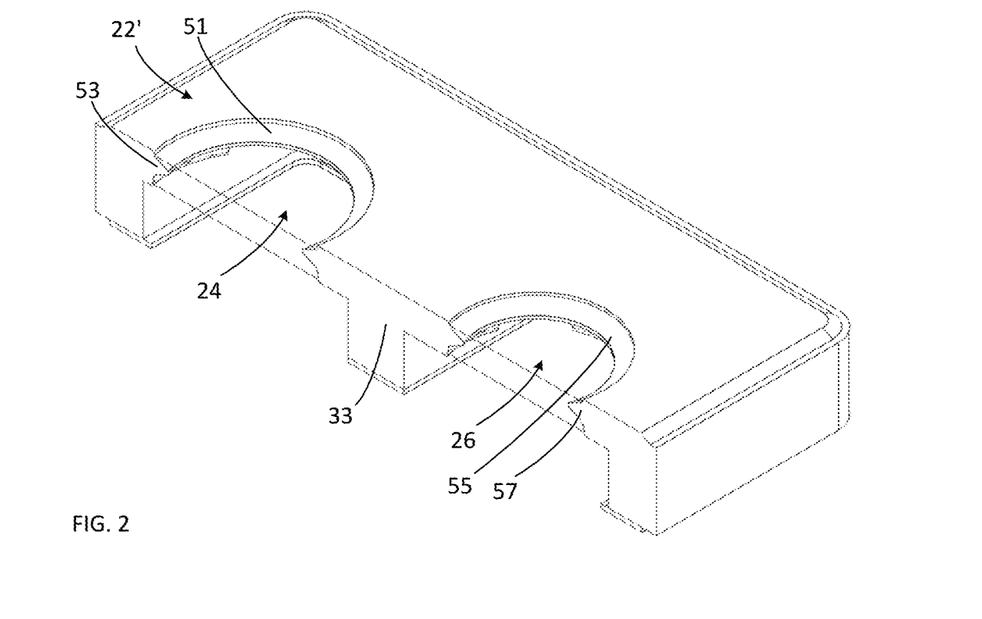
FIG. 2 is a cross sectional view of the cap of FIG. 1 taken with the cap arranged such that its top face is upwardly facing.

Shown in FIG. 2 is a cross sectional view of the cap 22 with its top side facing upwardly. From the cross section, it can be seen that the main circularly shaped opening 24a of the opening 24 is formed by a sidewall 51 that carries a ridge 53 that extends outwardly toward the center of the main circularly shaped opening 24a; similarly, the main circularly shaped opening 26a of the opening 26 is formed by a sidewall 55 that carries a ridge 57 that extends outwardly toward the center of the main circularly shaped opening 26a. Note that the semi-circularly shaped openings 24b, 24c and 26b, 26c lack this feature, and are instead defined by smooth, straight sidewalls and a bottom surface of the top side of the cap 22. The ridges 53 and 57 may extend around the entire sidewalls 51 and 55 of the main circularly shaped openings 24a and 26a, or may instead extend partly around the sidewalls 51 and 55 of the main circularly shaped openings 24a and 26a, leaving portions of those sidewalls 51 and 55 smooth and straight. In some instances, features (e.g., a valve structure) may be formed into the cap 22 to allow the escape of internal air in the event of internal air expansion due to the rise in temperature. Although the openings 24 and 26 are shown as being circularly shaped, they may instead take other shapes, such as oval, square, rectangular, etc.

Figure 3:
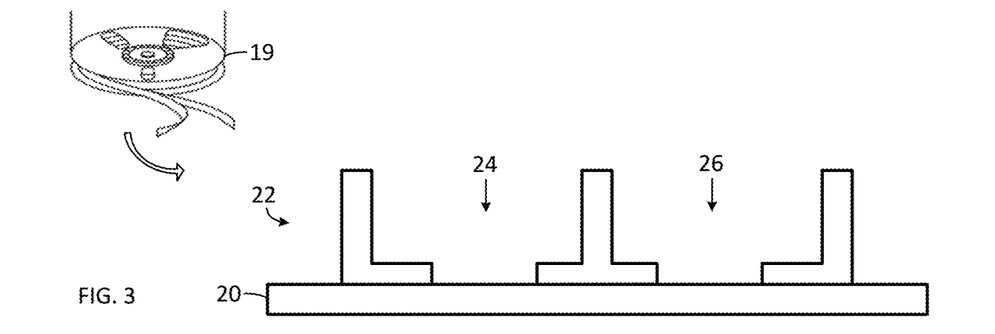
FIG. 3 is a diagrammatical view of a cap substrate (forming the cap of FIG. 1 once the light transmissible apertures have been formed) on Kapton tape placed into a production environment in a "dead bug" position.

For the rest of this description, with initial reference to FIG. 3, the formation of one cap structure 22 will be described for clarity. To form the apertures, a portion of tape 20 from the reel 19 is stretched out and placed such that the bottom surface of the tape 20 faces downward and therefore such that the bottom side of the cap structure 22 faces upward in the "dead bug" position.

Figure 4:
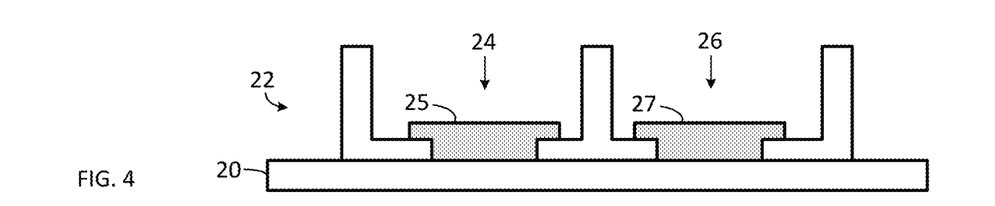
FIG. 4 is a diagrammatical view of the cap substrate of FIG. 3, after light transmissible material has been dispensed into the openings of the cap substrate.

Then, a light transmissible material 25 and 27 is dispensed from needles or nozzles of automated dispensing equipment into the openings 24 and 26 defined in the cap structure 22, as shown in FIG. 4. The light transmissible material 25, as explained above, may be either fully light transmissible or be tuned to transmit certain wavelengths of light while attenuating other wavelengths of light. It is expected that the light transmissible material 25 and 27 will remain within the main circularly shaped openings 24a and 26a of the openings 24 and 26 at this step.

As to the light transmissible material itself, it may be fully transparent to light, or may act as a bandpass filter, allowing only certain frequency bands of light (for example, infrared) to pass. The light transmissible material may in some instances instead act as a low-pass filter or high-pass filter, filtering out light above or below a certain frequency. The light transmissible material may be silicon, epoxy, or acrylic based, as an example.

Figure 5:
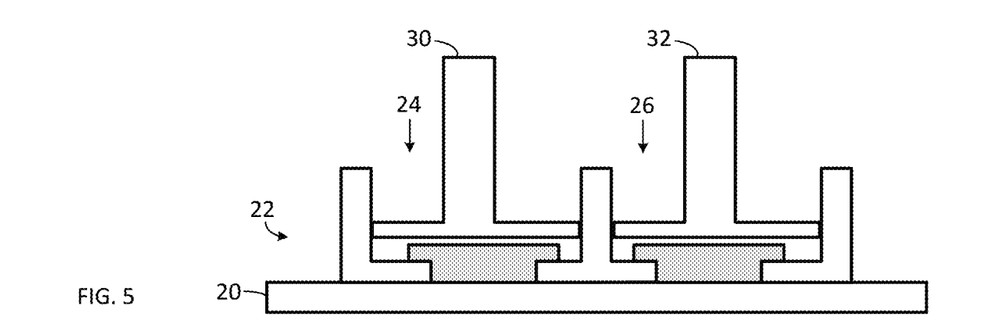
FIG. 5 is a diagrammatical view of the cap substrate of FIG. 4 showing the application of a hot tool to the dispensed light transmissible material to compress the material.

Thereafter, as shown in FIG. 5, hot tools 30 and 32 having a shape substantially equal to the interior diameter of the openings 24 and 26 are respectively placed into the openings 24 and 26 and pressed onto the light transmissible material 25 and 27, then removed. This has the result of pressing the bottom surface of the light transmissible material 25 and 27 into a shape corresponding to the shape of the surface of the hot tools 30 and 32 facing the light transmissible material 25 and 27, with excess light transmissible material flowing into the semi-circularly shaped openings 24b, 24c and 26b, 26c. Note here that when pressed by the hot tools 30 and 32, the melted light transmissible material will flow fully around the ridges 53 and 57 of the main circularly shaped openings 24a and 26a of the openings 24 and 26. When cured, these ridges 53 and 57 securely mechanically anchor the light transmissible material 25 and 27 in place.

The surface of the hot tools 30 and 32 facing the light transmissible material 25 and 27 may be convex in shape so as to form the bottom surface of the light transmissible material 25 and 27 into a concave shape; conversely, the surface of the hot tools 30 and 32 facing the light transmissible material 25 and 27 may be concave in shape so as to form the bottom surface of the light transmissible material 25 and 27 into a convex shape. As an alternative, the surface of the hot tools 30 and 32 facing the light transmissible materials may be flat in shape so as to form the bottom surface of the light transmissible material to be flat in shape.

Figure 6:
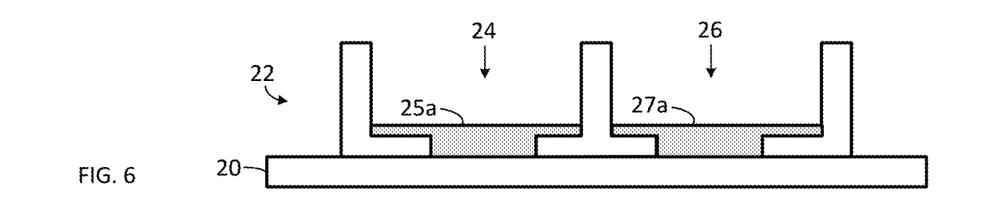
FIG. 6 is a diagrammatical view of the cap substrate of FIG. 5 showing how the hot tool has compressed the dispensed light transmissible material, and showing the cap substrate as being ready for curing.
Figure 7:
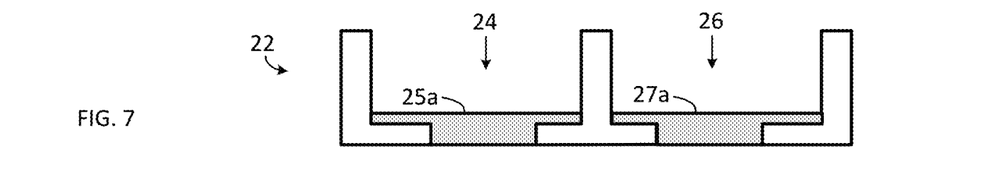
FIG. 7 is a diagrammatical view of the cap substrate of FIG. 5 after curing with the tape having been removed, thereby forming the cap of FIG. 1.

Depending upon the temperature of the hot tools 30 and 32, this action may also perform a pre-curing of the light transmissible material 25 and 27. Then, while the cap structure 22 is still attached to the tape 20, the cap structure 22 is placed into a curing environment (e.g., an oven that applies heat, or in the presence of a curing light) in order to fully cure the transmissible material 25 and 27 so that it becomes light transmissible apertures 25a and 27a, as shown in FIG. 6. The cap structure 22 is then removed from the tape 20, as shown in FIG. 7.

As an alternative to removing the hot tools 30 and 32 prior to curing, the hot tools 30 and 32 may instead be left in place during the curing, and removed thereafter, prior to removal of the tape 20.

As an alternative to a single layer of light transmissible material 25 and 27 being dispensed then cured, multiple layers may be dispensed and cured, with the process order being the dispensing of one layer, the hot pressing of that layer with a hot tool, and the curing of that layer, before moving on to dispensing the next layer, hot pressing that next layer, curing that next layer, etc.

Figure 8:
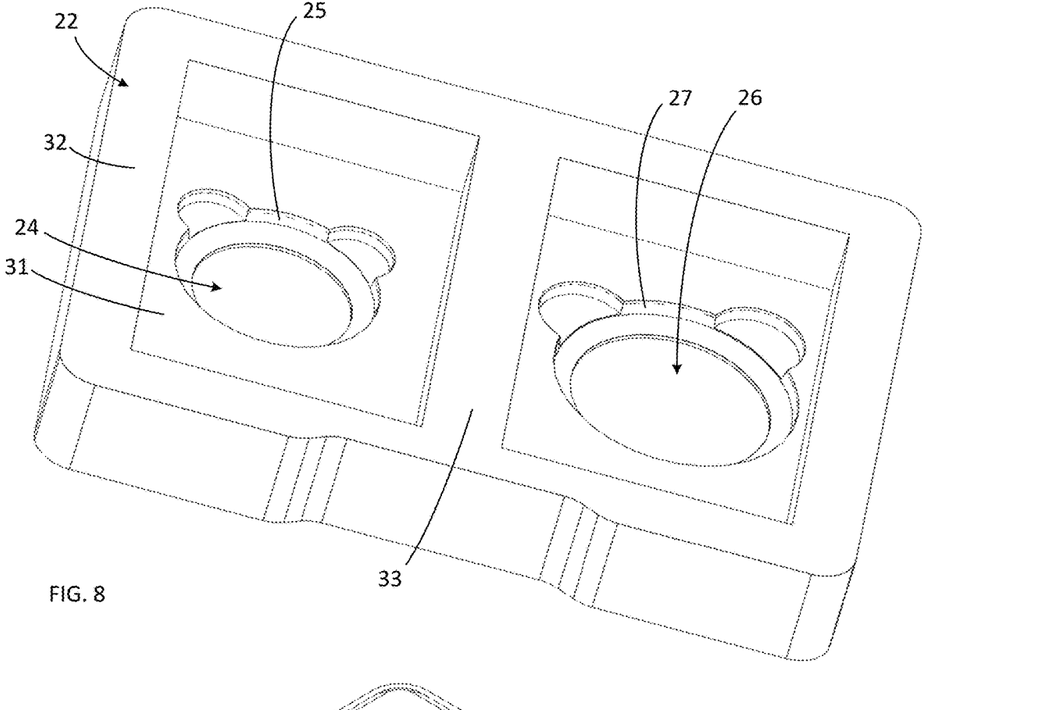
FIG. 8 is a perspective view of the bottom face of the cap described with the light transmissible apertures formed and shown.

Shown in FIG. 8 is the bottom surface of the cap 22, where it can be seen that the light transmissible apertures 25a and 27a have been installed within the openings 24 and 26 (with the top surface of the light transmissible apertures 25a and 27a being represented by the illustrated dotted line), and that excess material has properly flowed from the main circularly shaped openings 24a and 26a into the semi-circularly shaped openings 24b, 24c and 26b, 26c.

Figure 9:
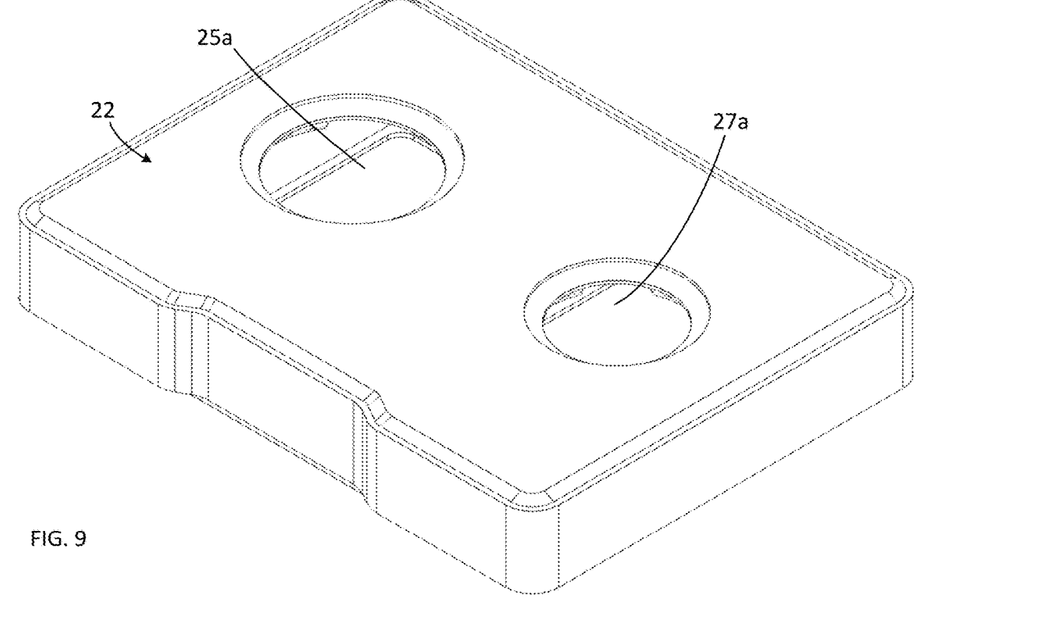
FIG. 9 is a perspective view of the top face of the cap described herein.

The top surface of the cap 22 is shown in FIG. 9, where the light transmissible apertures 25a and 27a as installed within the openings 24 and 26 can also be observed.

Figure 10:
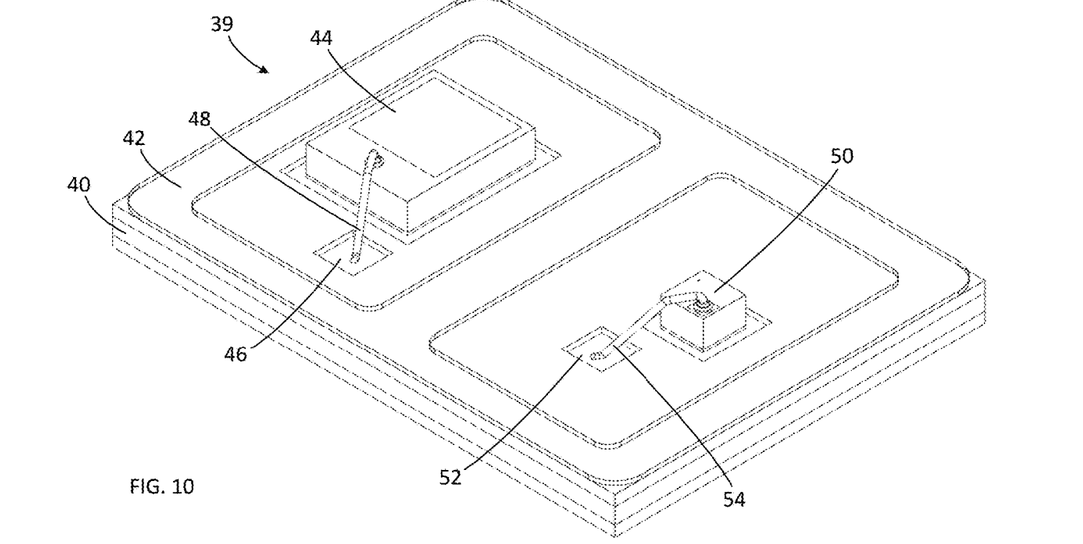
FIG. 10 is a perspective view of a top face of a light sensor substrate having light sensing components installed thereon, but without the cap formed herein in place.

After removal of the tape 20, the cap 22 is picked up and placed onto a light sensor unit containing passive and/or active components. A sample light sensing unit 39 is shown in FIG. 10. This light sensing unit 39 is an active proximity sensor, including a substrate 40 having a light source (e.g., infrared) 50 connected to a wiring layer on or within the substrate 40 by a lead 54 connected to a pad 52, and a light sensor (e.g., infrared) 44 connected to a wiring layer on or within the substrate 40 by a lead 48 connected to a pad 46. To sense proximity of an object, the light sensor 44 detects photons received from the light source 50, and a sufficient level of detected photons can be inferred to mean an object is in proximity. A bonding layer 42 is dispensed onto the surface of the substrate 40, and bonds the cap 22 to the substrate 40 over the light source 50 and light sensor 44 once the cap 22 is placed onto the substrate 40.

Figure 11:
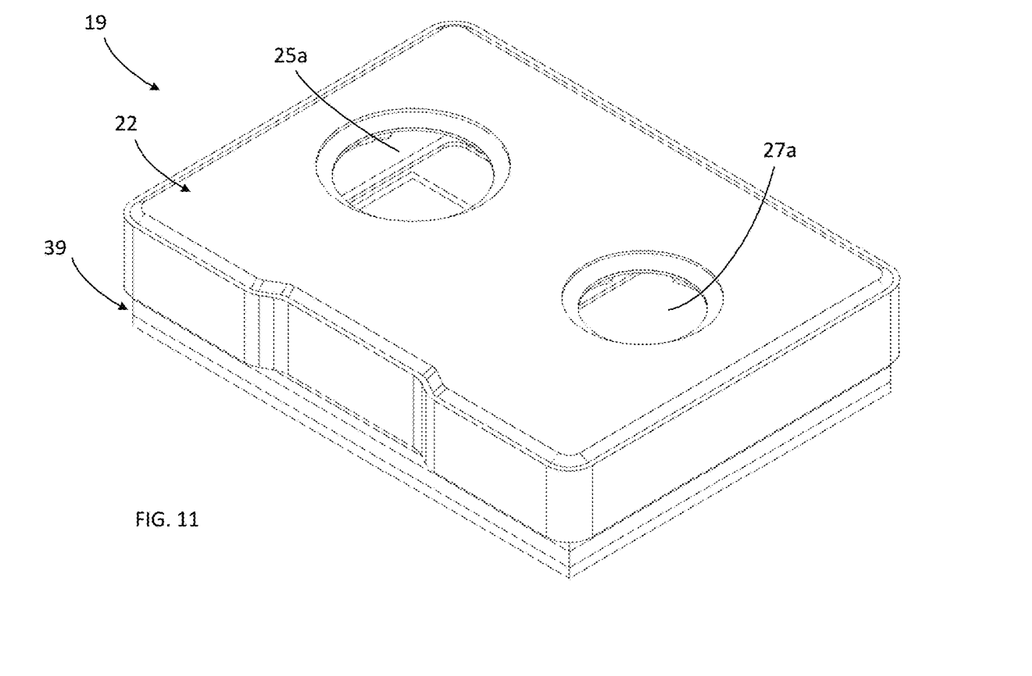
FIG. 11 is a perspective view of the light sensing substrate of FIG. 10 after bonding of the cap into place to thereby form a light sensing module described herein.

The light sensor module 19 as finished can be seen in FIG. 11. As should be appreciated, any suitable components may be on the substrate 40 within the light sensor module 19, for example to produce a proximity sensor, an ambient light sensor, a time of flight ranging sensor, etc.

As an alternative to the above steps being performed beginning with the cap 22 being on a length of tape, the cap 22 may instead be placed into a metal carrier, and the above steps them performed. In the instance where a metal carrier is used, the metal carrier may be shaped so as to influence the shape of the light transmissible apertures 25a and 27a formed. For example, the metal carrier may be shaped so as to form the top surface of the light transmissible apertures 25a and 27a into convex or concave shapes, or may be shaped so that the top surface of the light transmissible apertures 25a and 27a is above or below the top surface of the cap 22. As another alternative, the cap 22 can be placed in a live-bug position with the inner surface thereof (bottom surface) being sealed. The light transmissible material 25 and 27 may be dispensed from the top sides of the openings 24 and 26 defined in the cap 22. When a controlled volume of material is dispensed, its surface tension is then cured to a designed shape, such as a designed convex shape, without the of a hot tool.

The advantages of the design and formation process described above are multiple. The formation of the light transmissible apertures 25a and 27a using the formation process described above greatly reduces the thickness of the top wall of the cap 22, for example down to 70 μm to 80 μm or even below. By reducing the thickness of the top wall of the cap 22 while still maintaining the internal room for the internal passive and/or active components, the thickness of the light sensor module 19 itself can be reduced to below 0.8 mm, allowing for the production of thinner consumer electronic devices that use the light sensor module 19, or freeing up extra room inside the consumer electronic devices that use the light sensor module 19. In addition, by using light transmissible dispensable material as opposed to glass or injection molded material to form the light transmissible apertures 25a and 27a, a wider selection of material is provided. In addition, production costs can be reduced, since installing glass into a cap can be expensive, and since injection molding produces a large amount of waste material not present with the formation process described above. Still further, the use of the formation process described above allows the production of light transmissible apertures and having shapes not easily or cheaply achievable with glass or injection molding.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A cap for a light sensor, the cap comprising:
   a top wall;
   a sidewall extending perpendicularly from the top wall and extending therearound;
   a partition sidewall extending from one portion of the sidewall to another portion of the sidewall to thereby define first and second cavities;
   wherein the first cavity includes a central through-opening that extends through the top wall;
   a lens installed within the central through-opening, with the lens having a cavity defined in its exterior sidewall to completely encircle a lower portion of the exterior sidewall;
   the central through-opening being defined by an interior sidewall extending through the top wall, with a ridge extending outwardly from the interior sidewall, the interior sidewall and ridge being integrally formed as a monolithic unit;
   at least one relief blind-opening that extends into but not through the top wall, wherein the at least one relief blind-opening intersects the central through-opening so as to be in fluid communication therewith; and
   wherein the ridge extends completely around the interior sidewall so that the lens is mechanically anchored in place by the ridge interfacing with the entirety of the cavity defined in the exterior sidewall of the lens, while an upper portion of the exterior sidewall of the lens extends into the at least one relief blind-opening and in physical contact with portions of the top wall defining the at least one relief blind-opening.

2. The cap of claim 1, wherein the central through-opening is circularly shaped.

3. The cap of claim 2, wherein the at least one relief blind-opening is semi-circularly shaped.

4. The cap of claim 2, wherein the at least one relief blind-opening comprises first and second relief blind-openings, the first relief blind-opening extending into but not through the top wall and intersecting the central through-opening so as to be in fluid communication therewith, the second relief blind-opening extending into but not through the top wall and intersecting the central through-opening so as to be in fluid communication therewith.

5. The cap of claim 1, wherein the at least one relief blind-opening is semi-circularly shaped.

6. The cap of claim 1, wherein the at least one relief blind-opening comprises first and second relief blind-openings, the first relief blind-opening extending into but not through the top wall and intersecting the central through-opening so as to be in fluid communication therewith, the second relief blind-opening extending into but not through the top wall and intersecting the central through-opening so as to be in fluid communication therewith.

7. The cap of claim 1, wherein the lens has a top surface that is convex in shape.

8. The cap of claim 1, wherein the lens has a bottom surface that is concave in shape.

9. A light sensor module comprising:
   a substrate:
   a light sensing circuit connected to a first interconnect on the substrate;
   a light sourcing circuit connected to a second interconnect on the substrate; and
   a cap affixed to the substrate to cover the light sensing circuit and light sourcing circuit, the cap comprising:
   a top wall;
   a sidewall extending perpendicularly from the top wall and extending therearound;
   a partition sidewall extending from one portion of the sidewall to another portion of the sidewall to thereby define first and second cavities, the first cavity being positioned over the light sensing circuit, the second cavity being positioned over the light sourcing circuit;
   wherein the first cavity includes a first central through-opening that extends through the top wall;

a first lens installed within the first central through-opening, with the first lens having a cavity defined in its exterior sidewall to completely encircle a lower portion of the exterior sidewall;

the first central through-opening being defined by a first interior sidewall extending through the top wall, with a first ridge extending outwardly from the first interior sidewall, the first interior sidewall and first ridge being integrally formed as a monolithic unit;

at least one first relief blind-opening that extends into but not through the top wall, wherein the at least one first relief blind-opening intersects the first central through-opening so as to be in fluid communication therewith;

wherein the first ridge extends completely around the first interior sidewall so that the first lens is mechanically anchored in place by the first ridge interfacing with an entirety of the cavity defined in the exterior sidewall of the first lens, while an upper portion of the exterior sidewall of the first lens extends into the at least one first relief blind-opening and in physical contact with portions of the top wall defining the at least one first relief blind-opening;

wherein the second cavity includes a second central through-opening that extends through the top wall;

a second lens installed within the second central through-opening, with the second lens having a cavity defined in its exterior sidewall to completely encircle a lower portion of that exterior sidewall;

the second central through-opening being defined by a second interior sidewall extending through the top wall, with a second ridge extending outwardly from the second interior sidewall, the second interior sidewall and second ridge being integrally formed as a monolithic unit;

at least one second relief blind-opening that extends into but not through the top wall, wherein the at least one second relief blind-opening intersects the second central through-opening so as to be in fluid communication therewith; and wherein the second ridge extends completely around the second interior sidewall so that the second lens is mechanically anchored in place by the second ridge interfacing with the entirety of the cavity defined in the exterior sidewall of the second lens, while an upper portion of the exterior sidewall of the second lens extends into the at least one second relief blind-opening and in physical contact with portions of the top wall defining the at least one second relief blind-opening.

10. The light sensor module of claim 9, wherein the first central through-opening is circularly shaped; and wherein the second central through-opening is circularly shaped.

11. The light sensor module of claim 9, wherein the at least one first relief blind-opening comprises a pair of first relief blind-openings, each extending into but not through the top wall and intersecting a respective one of the first and second central through-openings so as to be in fluid communication therewith.

* * * * *